United States Patent
Wu et al.

(10) Patent No.: US 8,861,250 B1
(45) Date of Patent: Oct. 14, 2014

(54) MASK READ-ONLY MEMORY

(71) Applicant: eMemory Technology Inc., Hsin-Chu (TW)

(72) Inventors: Meng-Yi Wu, Hsinchu County (TW); Chih-Hao Huang, Hsinchu County (TW); Kuan-Ming Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 13/955,122

(22) Filed: Jul. 31, 2013

(51) Int. Cl.
*G11C 17/00* (2006.01)
*G11C 17/12* (2006.01)

(52) U.S. Cl.
CPC ........................................ *G11C 17/12* (2013.01)
USPC ................. 365/104; 365/185.21; 365/189.18; 365/189.15

(58) Field of Classification Search
USPC .................. 365/104, 185.21, 185.18, 189.09, 365/189.15
See application file for complete search history.

(56) References Cited

U.S. PATENT DOCUMENTS

| | | | |
|---|---|---|---|
| 4,057,787 A | 11/1977 | Heuer et al. | |
| 4,744,054 A | 5/1988 | Kawata et al. | |
| 7,471,541 B2 * | 12/2008 | Fong et al. | 365/104 |
| 8,344,445 B2 | 1/2013 | Lu et al. | |
| 2004/0135256 A1 | 7/2004 | Takahashi et al. | |
| 2009/0090957 A1 | 4/2009 | Onda | |
| 2010/0265755 A1 | 10/2010 | Ching et al. | |
| 2012/0163072 A1 | 6/2012 | Lu et al. | |
| 2012/0248538 A1 | 10/2012 | Qiu et al. | |

FOREIGN PATENT DOCUMENTS

| | | |
|---|---|---|
| EP | 1463119 A1 | 9/2004 |
| EP | 2439746 A1 | 4/2012 |
| JP | 2000077543 A | 3/2000 |

OTHER PUBLICATIONS

European Patent Office, "Search Report", Jan. 30, 2014.

* cited by examiner

*Primary Examiner* — David Lam
(74) *Attorney, Agent, or Firm* — WPAT, PC; Justin King

(57) ABSTRACT

A novel mask read-only memory is provided. After the mask read-only memory leaves the factory, the mask read-only memory has two types of cell structures. The first type cell structure records a first storing state (e.g. the logic state "1"), and the second type cell structure records a second storing state (the logic state "0").

19 Claims, 7 Drawing Sheets

US 8,861,250 B1

MASK READ-ONLY MEMORY

FIELD OF THE INVENTION

The present invention relates to a non-volatile memory, and more particularly to a mask read-only memory (Mask ROM).

BACKGROUND OF THE INVENTION

As is well known, a non-volatile memory is able to continuously retain data after the supplied power is interrupted. Generally, after the non-volatile memory leaves the factory, the non-volatile memory may be programmed by the user. After the non-volatile memory is programmed, data are recorded into the non-volatile memory. Moreover, depending on the programmable times, non-volatile memories may be classified into two types, i.e. a multi-time programming memory (also referred as a MTP memory) and a one time programming memory (also referred as an OTP memory). Generally, the MTP memory can be programmed multiple times by the user. On the other hand, the OTP memory can be programmed once. After the OTP memory is programmed, the data stored in the OTP memory is hard to modify.

Moreover, a mask read-only memory (also referred as a Mask ROM) is another widely-used non-volatile memory. After the mask read-only memory leaves the factory, all stored data are recorded in the mask read-only memory. The data stored in the mask read-only memory can only be read by the user, but cannot be programmed by the user. That is, the stored data should be provided to the manufacturer of the mask read-only memory at first. After the mask read-only memory is fabricated by the manufacturer and sent to the user, all stored data have been recorded into the mask read-only memory, and the mask read-only memory fails to be programmed.

Since the mask read-only memory has many advantages such as low cost, high reliability and high capability, the mask read-only memory has been widely applied to various electronic devices.

FIG. 1 is a schematic perspective view illustrating a conventional non-volatile semiconductor memory cell with dual functions. The conventional non-volatile semiconductor memory cell is disclosed in U.S. Pat. No. 8,344,445.

The memory cell 300 has a substrate with a P-well region 310. An active region 315 is formed in a surface of the P-well region 310. A gate oxide layer 321 is formed on the substrate, and a first polysilicon gate 313-1 is formed on the gate oxide layer 321. Another gate oxide layer 320 is formed on the substrate, and a second polysilicon gate 313-2, a third polysilicon gate 313-3 and a charge storage layer 314 are formed on the gate oxide layer 320.

The active region 315 is divided into a first N+ diffusion region 311-1, a second N+ diffusion region 311-2 and a third N+ diffusion region 311-3. The first N+ diffusion region 311-1 is located at a left side of the first polysilicon gate 313-1. The third N+ diffusion region 311-3 is arranged between the first polysilicon gate 313-1 and the second polysilicon gate 313-2. The second N+ diffusion region 311-2 is located at the right side of the second polysilicon gate 313-2 and the third polysilicon gate 313-3. Moreover, two contacts 316-1 and 316-2 are formed on the first N+ diffusion region 311-1 and the second N+ diffusion region 311-2, respectively.

The memory cell 300 as shown in FIG. 1 may be used as an OTP memory cell or a MTP memory cell. After an integrated circuit (IC) with such memory cells is acquired by the user, the integrated circuit (IC) may be used as an OTP memory or a MTP memory to be programmed. However, the non-volatile semiconductor memory cell as shown in FIG. 1 is not a mask read-only memory cell.

SUMMARY OF THE INVENTION

The present invention provides a mask read-only memory with a first state cell structure and a second state cell structure by modifying the structure of the conventional non-volatile semiconductor memory cell.

An embodiment of the present invention provides a mask read-only memory. The mask read-only memory includes a substrate, a first gate structure, a second gate structure, a third gate structure, a first diffusion region, a second diffusion region, a fourth gate structure, a fifth gate structure, a sixth gate structure, a third diffusion region, and a fourth diffusion region. The first gate structure is formed on a surface of the substrate for receiving a word line voltage during a read cycle. The second gate structure formed on the surface of the substrate for receiving a read voltage during the read cycle. The third gate structure is formed on the surface of the substrate. The first diffusion region is formed in the surface of the substrate and located adjacent to a first side of the first gate structure for generating a first bit line voltage during the read cycle. The second diffusion region is formed in the surface of the substrate, and located adjacent to a second side of the first gate structure, a first side of the second gate structure and a first side of the third gate structure. The fourth gate structure is formed on the surface of the substrate for receiving the word line voltage during the read cycle. The fifth gate structure is formed on the surface of the substrate for receiving the read voltage during the read cycle. The sixth gate structure is formed on the surface of the substrate. The third diffusion region is formed in the surface of the substrate and located adjacent to a first side of the fourth gate structure for generating a second bit line voltage during the read cycle. The fourth diffusion region is formed in the surface of the substrate, and located adjacent to a second side of the fourth gate structure, a first side of the fifth gate structure and a first side of the sixth gate structure. The fourth diffusion region receives the read voltage during the read cycle. Moreover, the first bit line voltage is different from the second bit line voltage.

Another embodiment of the present invention provides a mask read-only memory. The mask read-only memory includes a substrate, a first gate structure, a second gate structure, a third gate structure, a first diffusion region, a second diffusion region, a third diffusion region, a fourth gate structure, a fifth gate structure, a sixth gate structure, a fourth diffusion region, a fifth diffusion region, and a sixth diffusion region. The first gate structure is formed on a surface of the substrate for receiving a word line voltage during a read cycle. The second gate structure is formed on the surface of the substrate. The third gate structure is formed on the surface of the substrate. The first diffusion region is formed in the surface of the substrate and located adjacent to a first side of the first gate structure for generating a first bit line voltage during the read cycle. The second diffusion region is formed in the surface of the substrate, and located adjacent to a second side of the first gate structure, a first side of the second gate structure and a first side of the third gate structure. The third diffusion region is formed in the surface of the substrate for receiving a select line voltage during the read cycle. The fourth gate structure is formed on the surface of the substrate for receiving the word line voltage during the read cycle. The fifth gate structure is formed on the surface of the substrate. The sixth gate structure is formed on the surface of the substrate. The fourth diffusion region is formed in the surface of the substrate and located adjacent to a first side of the fourth gate structure for generating a second bit line voltage during the read cycle. The fifth diffusion region is formed in the surface of the substrate, and located adjacent to a second side of the fourth gate structure, a first side of the fifth gate structure and a first side of the sixth gate structure. The sixth diffusion region is formed in the surface of the substrate and contacted with the fifth diffusion region for receiving the select line voltage during the read cycle. In addition, the first bit line voltage is different from the second bit line voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

As previously described, after the mask read-only memory leaves the factory, all stored data have been recorded in the mask read-only memory. Consequently, the mask read-only memory should have two types of cell structures. The first type cell structure (also referred as a first state cell structure) records a first storing state (e.g. the logic state "1"), and the second type cell structure (also referred as a second state cell structure) records a second storing state (the logic state "0"). The two types of cell structures will be illustrated in more details as follows.

Figure 1:
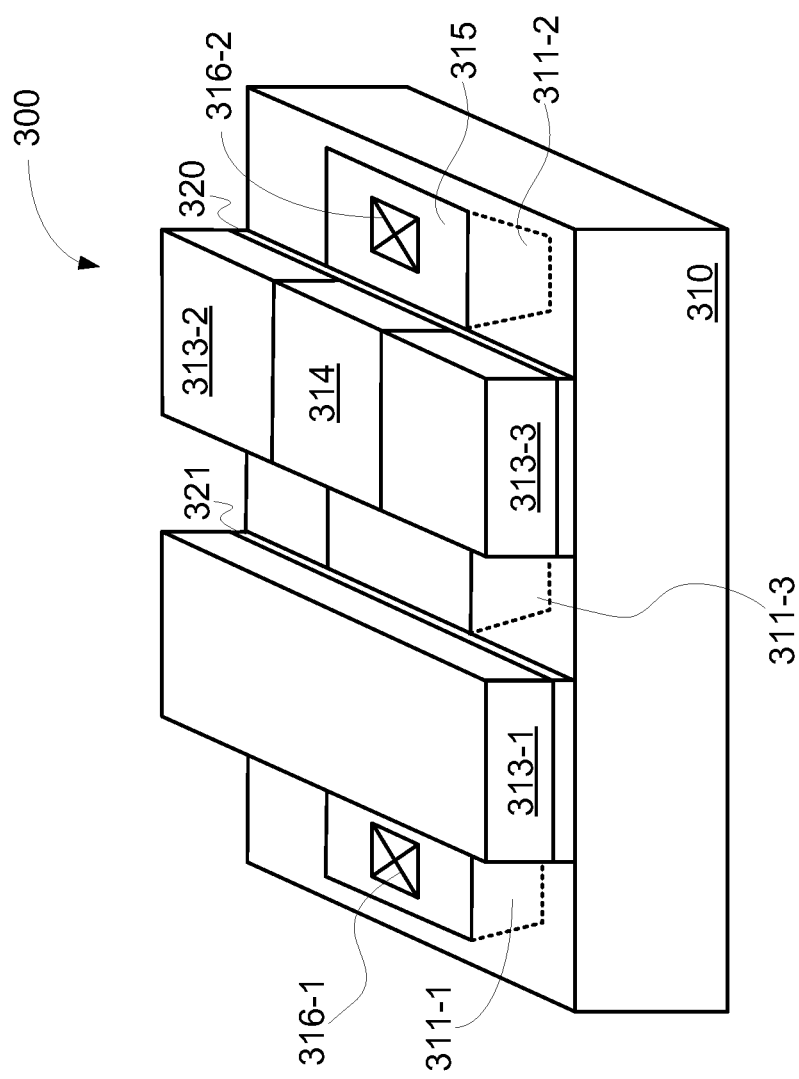
FIG. 1 (prior art) is a schematic perspective view illustrating a conventional non-volatile semiconductor memory cell with dual functions.
Figure 2A:
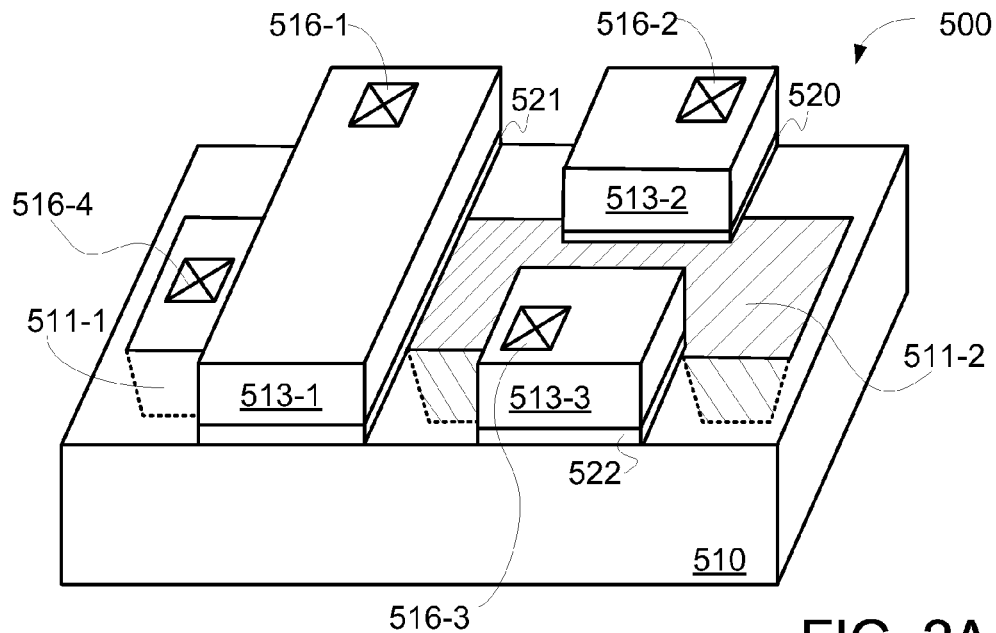
FIG. 2A is a schematic perspective view illustrating a first state cell structure of a mask read-only memory according to a first embodiment of the present invention.
Figure 2B:
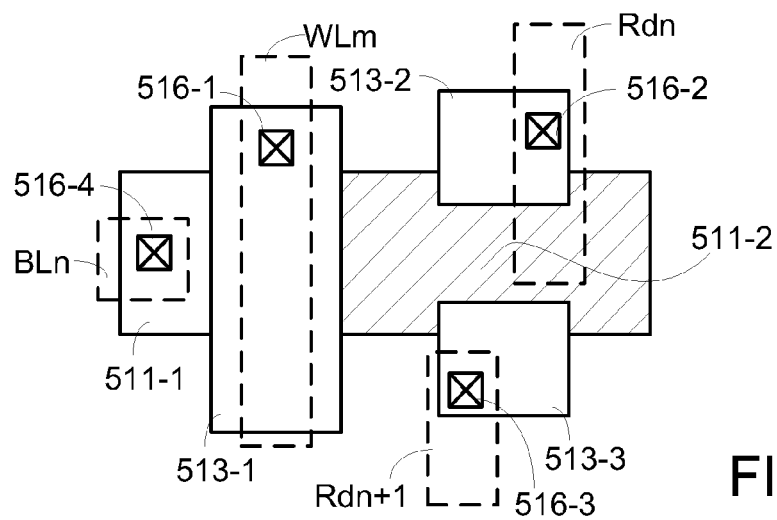
FIG. 2B is a schematic top view illustrating the first state cell structure of the mask read-only memory as shown in FIG. 2A.
Figure 2C:
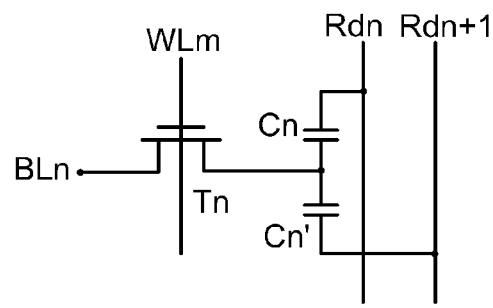
FIG. 2C schematically illustrates an equivalent circuit of the first state cell structure of the mask read-only memory as shown in FIG. 2A.

FIG. 2A is a schematic perspective view illustrating a first state cell structure of a mask read-only memory according to a first embodiment of the present invention. FIG. 2B is a schematic top view illustrating the first state cell structure of the mask read-only memory as shown in FIG. 2A. FIG. 2C schematically illustrates an equivalent circuit of the first state cell structure of the mask read-only memory as shown in FIG. 2A. Please refer to FIGS. 2A, 2B and 2C. The first state cell structure 500 has a substrate with a P-well region 510. A first gate structure, a second gate structure and a third gate structure are formed on the P-well region 510 of the substrate. The first gate structure comprises a gate oxide layer 521 and a first polysilicon gate 513-1 on the gate oxide layer 521. The second gate structure comprises a gate oxide layer 520 and a second polysilicon gate 513-2 on the gate oxide layer 520. The third gate structure comprises a gate oxide layer 522 and a third polysilicon gate 513-3 on the gate oxide layer 522.

Moreover, a first N+ diffusion region 511-1 and a second N+ diffusion region 511-2 are formed in a surface of the P-well region 510 of the substrate. The first N+ diffusion region 511-1 is located adjacent to a first side of the first gate structure. The second N+ diffusion region 511-2 is located adjacent to a second side of the first gate structure and extended to a first side of the second gate structure and a first side of the third gate structure. Moreover, a first contact 516-1 is formed on the first polysilicon gate 513-1, a second contact 516-2 is formed on the second polysilicon gate 513-2, a third contact 516-3 is formed on the third polysilicon gate 513-3, and a fourth contact 516-4 is formed on the first N+ diffusion region 511-1.

After the first state cell structure 500 as shown in FIG. 2A is fabricated, a metallization process is performed. That is, the fourth contact 516-4 is connected to a bit line BLn, the first contact 516-1 is connected to a word line WLm, the second contact 516-2 is connected to a read line Rdn, and the third contact 516-3 is connected to another read line Rdn+1 (see FIG. 2B).

The equivalent circuit of the first state cell structure is schematically shown in FIG. 2C. The first N+ diffusion region 511-1, the first gate structure and the second N+ diffusion region 511-2 are collaboratively defined as a transistor Tn. The second gate structure and the second N+ diffusion region 511-2 are collaboratively defined as a capacitor Cn. The third gate structure and the second N+ diffusion region 511-2 are collaboratively defined as another capacitor Cn'. The gate terminal of the transistor Tn is connected to the word line WLm. A first terminal of transistor Tn is connected to the bit line BLn. A second terminal of transistor Tn is connected to a first end of the capacitor Cn and a first end of the capacitor Cn'. A second end of the capacitor Cn is connected to the read line Rdn. A second end of the capacitor Cn' is connected to the read line Rdn+1.

Figure 3A:
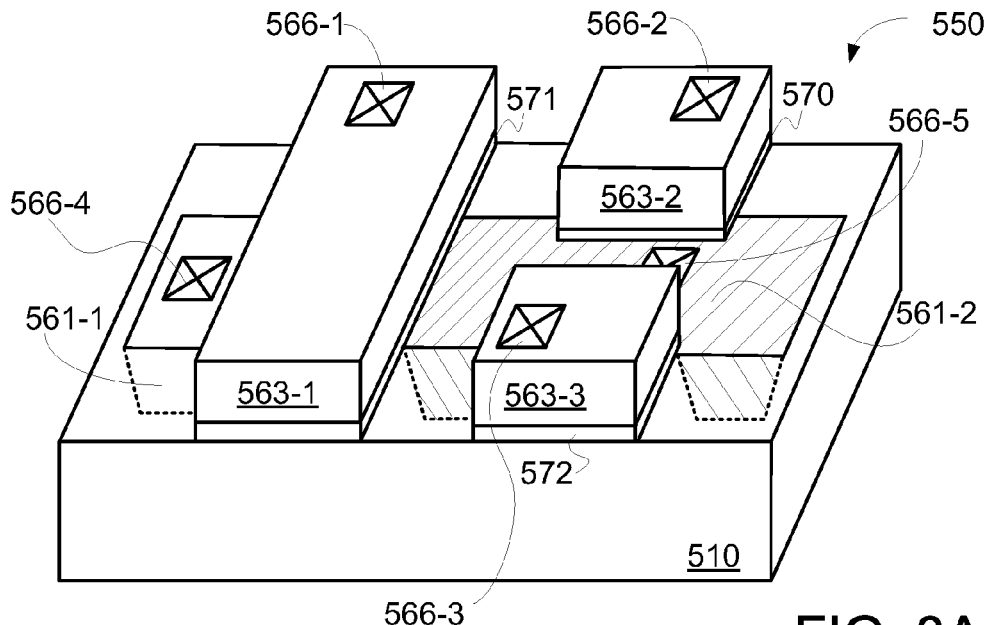
FIG. 3A is a schematic perspective view illustrating a second state cell structure of the mask read-only memory according to the first embodiment of the present invention.
Figure 3B:
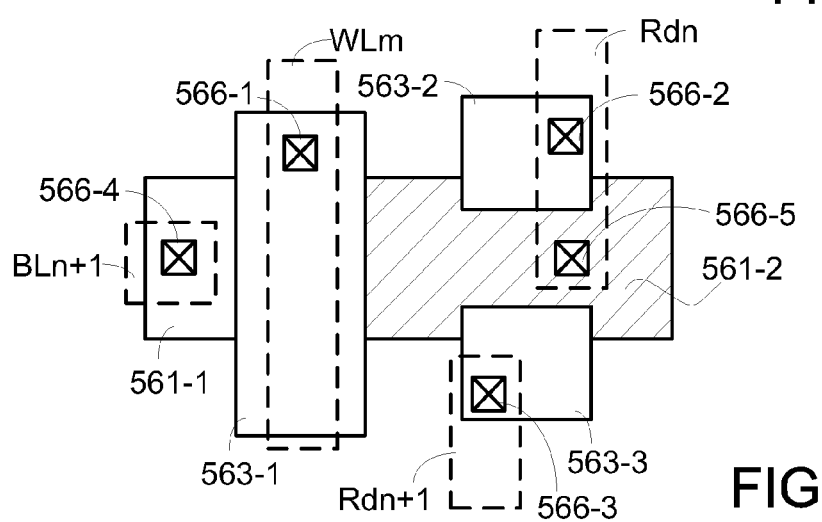
FIG. 3B is a schematic top view illustrating the second state cell structure of the mask read-only memory as shown in FIG. 3A.
Figure 3C:
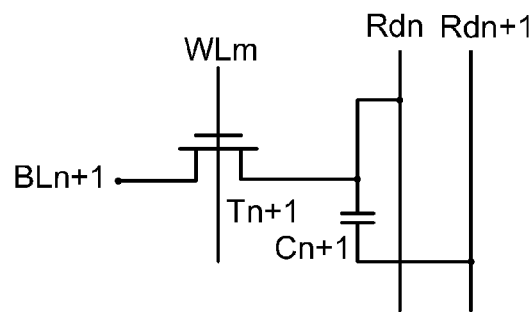
FIG. 3C schematically illustrates an equivalent circuit of the second state cell structure of the mask read-only memory as shown in FIG. 3A.

FIG. 3A is a schematic perspective view illustrating a second state cell structure of the mask read-only memory according to the first embodiment of the present invention. FIG. 3B is a schematic top view illustrating the second state cell structure of the mask read-only memory as shown in FIG. 3A. FIG. 3C schematically illustrates an equivalent circuit of the second state cell structure of the mask read-only memory as shown in FIG. 3A. Please refer to FIGS. 3A, 3B and 3C. The second state cell structure 550 has a substrate with a P-well region 510. A first gate structure, a second gate structure and a third gate structure are formed on the P-well region 510 of the substrate. The first gate structure comprises a gate oxide layer 571 and a first polysilicon gate 563-1 on the gate oxide layer 571. The second gate structure comprises a gate oxide layer 570 and a second polysilicon gate 563-2 on the gate oxide layer 570. The third gate structure comprises a gate oxide layer 572 and a third polysilicon gate 563-3 on the gate oxide layer 572.

Moreover, a first N+ diffusion region 561-1 and a second N+ diffusion region 561-2 are formed in a surface of the P-well region 510 of the substrate. The first N+ diffusion region 561-1 is located adjacent to a first side of the first gate structure. The second N+ diffusion region 561-2 is located adjacent to a second side of the first gate structure and extended to a first side of the second gate structure and a first side of the third gate structure. Moreover, a first contact 566-1 is formed on the first polysilicon gate 563-1, a second contact 566-2 is formed on the second polysilicon gate 563-2, a third contact 566-3 is formed on the third polysilicon gate 563-3, a fourth contact 566-4 is formed on the first N+ diffusion region 561-1, and a fifth contact 566-5 is formed on the second N+ diffusion region 561-2.

After the second state cell structure 550 as shown in FIG. 3A is fabricated, a metallization process is performed. That is, the fourth contact 566-4 is connected to a bit line BLn+1, the first contact 566-1 is connected to a word line WLm, the second contact 566-2 and the fifth contact 566-5 are both connected to a read line Rdn, and the third contact 566-3 is connected to another read line Rdn+1 (see FIG. 3B).

The equivalent circuit of the second state cell structure is schematically shown in FIG. 3C. The first N+ diffusion region 561-1, the first gate structure and the second N+ diffusion region 561-2 are collaboratively defined as a transistor Tn+1. The second gate structure and the second N+ diffusion region 561-2 are short-circuited. The third gate structure and the second N+ diffusion region 561-2 are collaboratively defined as another capacitor Cn+1. The gate terminal of the transistor Tn+1 is connected to the word line WLm. A first terminal of transistor Tn+1 is connected to the bit line BLn+1. A second terminal of transistor Tn is connected to the read line Rdn and a first end of the capacitor Cn+1. A second end of the capacitor Cn+1 is connected to the read line Rdn+1.

From the above discussions, the first state cell structure and the second state cell structure are distinguished because the second state cell structure further comprises the fifth contact 566-5. That is, the cell structure with the fifth contact 566-5 electrically connected to the read line Rdn is the second state cell structure. Whereas, the cell structure without the fifth contact 566-5 is the first state cell structure. During a process of defining a contact mask, the manufacturer may determine whether the fifth contact 566-5 is formed or not. Consequently, the fabricated mask read-only memory has two types of cell structures with different storing states.

Figure 4:
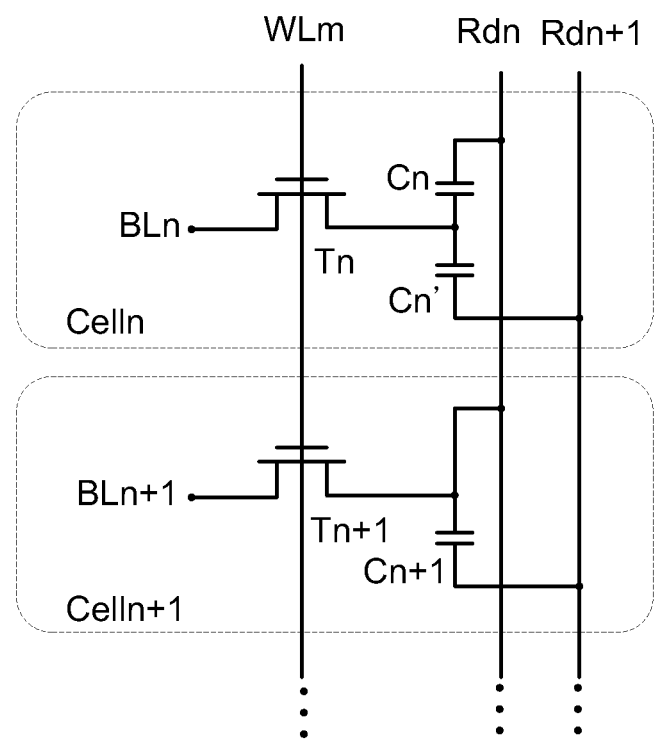
FIG. 4 schematically illustrates an equivalent circuit of the first state cell structure and the second state cell structure of the mask read-only memory according to the first embodiment of the present invention.

FIG. 4 schematically illustrates an equivalent circuit of the first state cell structure and the second state cell structure of the mask read-only memory according to the first embodiment of the present invention. As shown in FIG. 4, a first cell Celln records a first storing state, and a second cell Celln+1 records a second storing state. During a read cycle of reading the data from the first cell and the second cell, a word line voltage is received by the word line WLm, and a read voltage is received by the two read lines Rdn and Rdn+1. In an embodiment, each of the word line voltage and the read voltage is equal to a power supply voltage (Vcc), e.g. 3.3V.

When the word line voltage (3.3V) is received by the word line WLm, the transistors Tn and Tn+1 are turned on. In the first cell Celln, the read voltage (3.3V) fails to be transmitted from the read lines Rdn and Rdn+1 to the bit line BLn. Consequently, a first bit line voltage on the bit line BLn is 0V. In the second cell Celln+1, the read voltage (3.3V) can be transmitted from the read line Rdn to the bit line BLn+1. Consequently, a second bit line voltage on the bit line BLn+1 is 3.3V. That is, during the read cycle, the word line voltage and the read voltage are provided to the mask read-only memory. According to the bit line voltage, the storing state of the cell can be detected.

However, those skilled in the art will readily observe that numerous modifications and alterations may be made while retaining the teachings of the invention. For example, during the read cycle, only the read voltage is provided to the read line Rdn, but the read voltage is not provided to the read line Rdn+1. Similarly, the storing state of the cell can be accurately detected according to the bit line voltage.

Figure 5A:
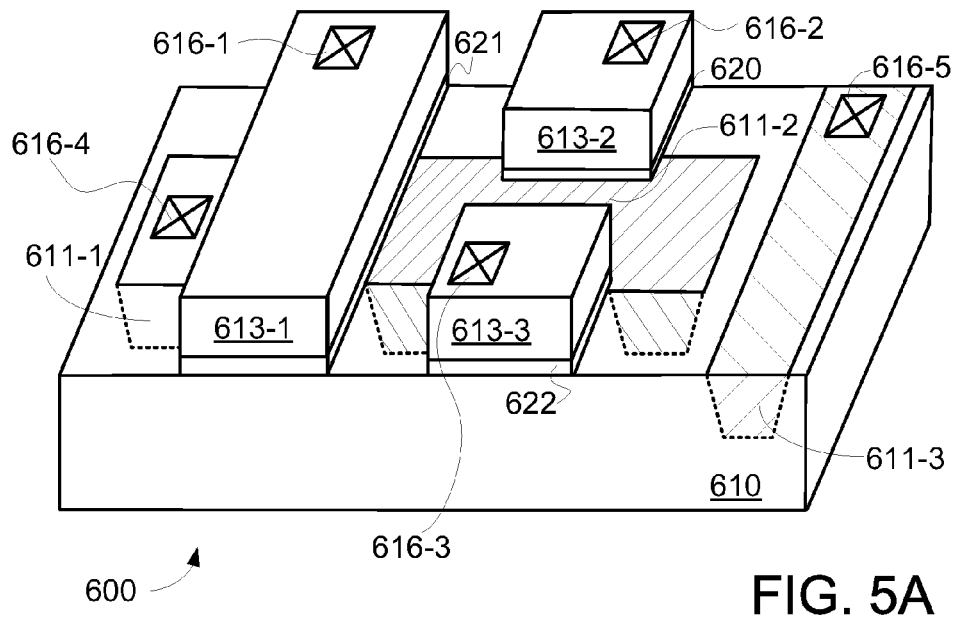
FIG. 5A is a schematic perspective view illustrating a first state cell structure of a mask read-only memory according to a second embodiment of the present invention.
Figure 5B:
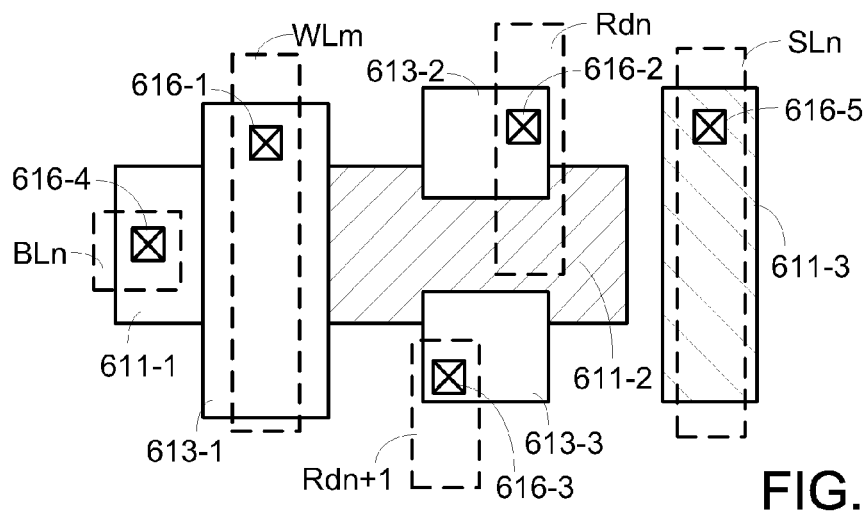
FIG. 5B is a schematic top view illustrating the first state cell structure of the mask read-only memory as shown in FIG. 5A.
Figure 5C:
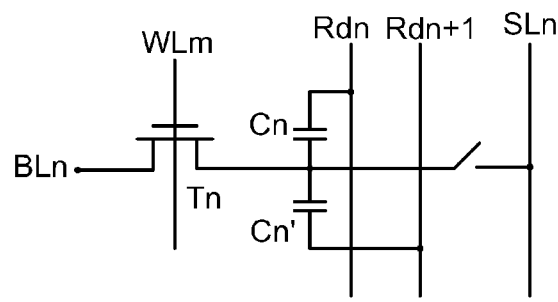
FIG. 5C schematically illustrates an equivalent circuit of the first state cell structure of the mask read-only memory as shown in FIG. 5A.

FIG. 5A is a schematic perspective view illustrating a first state cell structure of a mask read-only memory according to a second embodiment of the present invention. FIG. 5B is a schematic top view illustrating the first state cell structure of the mask read-only memory as shown in FIG. 5A. FIG. 5C schematically illustrates an equivalent circuit of the first state cell structure of the mask read-only memory as shown in FIG. 5A. Please refer to FIGS. 5A, 5B and 5C. The first state cell structure 600 has a substrate with a P-well region 610. A first gate structure, a second gate structure and a third gate structure are formed on the P-well region 610 of the substrate. The first gate structure comprises a gate oxide layer 621 and a first polysilicon gate 613-1 on the gate oxide layer 621. The second gate structure comprises a gate oxide layer 620 and a second polysilicon gate 613-2 on the gate oxide layer 620. The third gate structure comprises a gate oxide layer 622 and a third polysilicon gate 613-3 on the gate oxide layer 622.

Moreover, a first N+ diffusion region 611-1, a second N+ diffusion region 611-2 and a third N+ diffusion region 611-3 are formed in a surface of the P-well region 610 of the substrate. The first N+ diffusion region 611-1 is located adjacent to a first side of the first gate structure. The second N+ diffusion region 611-2 is located adjacent to a second side of the first gate structure and extended to a first side of the second gate structure and a first side of the third gate structure. The third N+ diffusion region 611-3 is separated from the first N+ diffusion region 611-1 and the second N+ diffusion region 611-2.

Moreover, a first contact 616-1 is formed on the first polysilicon gate 613-1, a second contact 616-2 is formed on the second polysilicon gate 613-2, a third contact 616-3 is formed on the third polysilicon gate 613-3, a fourth contact 616-4 is formed on the first N+ diffusion region 611-1, and a fifth contact 616-5 is formed on the third N+ diffusion region 611-3.

After the first state cell structure 600 as shown in FIG. 5A is fabricated, a metallization process is performed. That is, the fourth contact 616-4 is connected to a bit line BLn, the first contact 616-1 is connected to a word line WLm, the second contact 616-2 is connected to a read line Rdn, the third contact 616-3 is connected to another read line Rdn+1, and the fifth contact 616-5 is connected to a select line SLn (see FIG. 5B).

The equivalent circuit of the first state cell structure is schematically shown in FIG. 5C. The first N+ diffusion region 611-1, the first gate structure and the second N+ diffusion region 611-2 are collaboratively defined as a transistor Tn. The second gate structure and the second N+ diffusion region 611-2 are collaboratively defined as a capacitor Cn. The third gate structure and the second N+ diffusion region 611-2 are collaboratively defined as another capacitor Cn'. The gate terminal of the transistor Tn is connected to the word line WLm. A first terminal of transistor Tn is connected to the bit line BLn. A second terminal of transistor Tn is connected to a first end of the capacitor Cn and a first end of the capacitor Cn'. A second end of the capacitor Cn is connected to the read line Rdn. A second end of the capacitor Cn' is connected to the read line Rdn+1. In addition, the second terminal of transistor Tn is connected with the select line SLn.

Figure 6A:
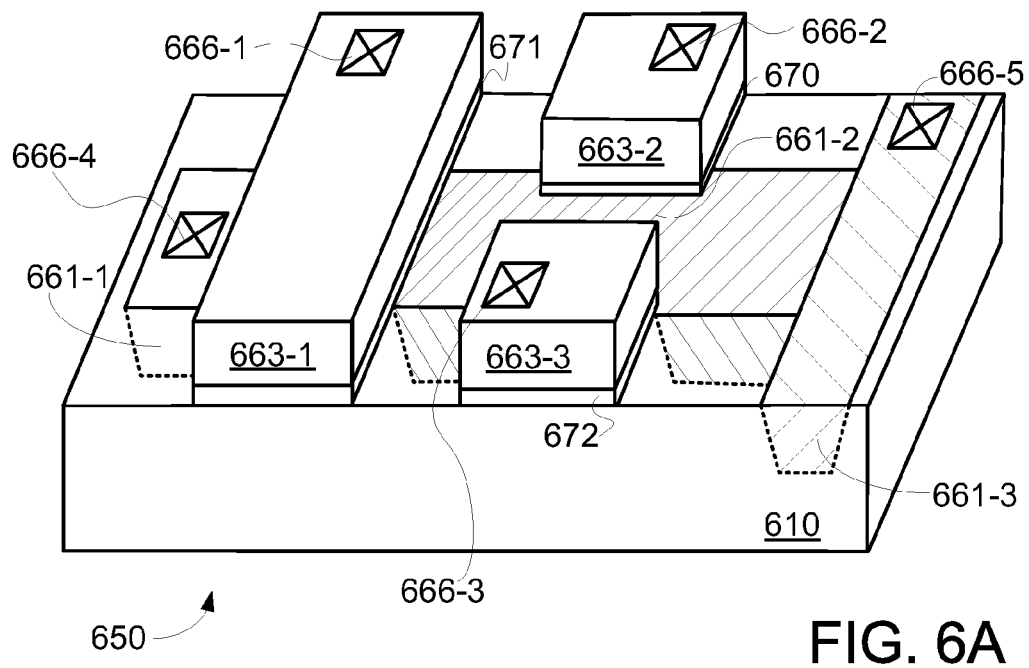
FIG. 6A is a schematic perspective view illustrating a second state cell structure of the mask read-only memory according to the second embodiment of the present invention.
Figure 6B:
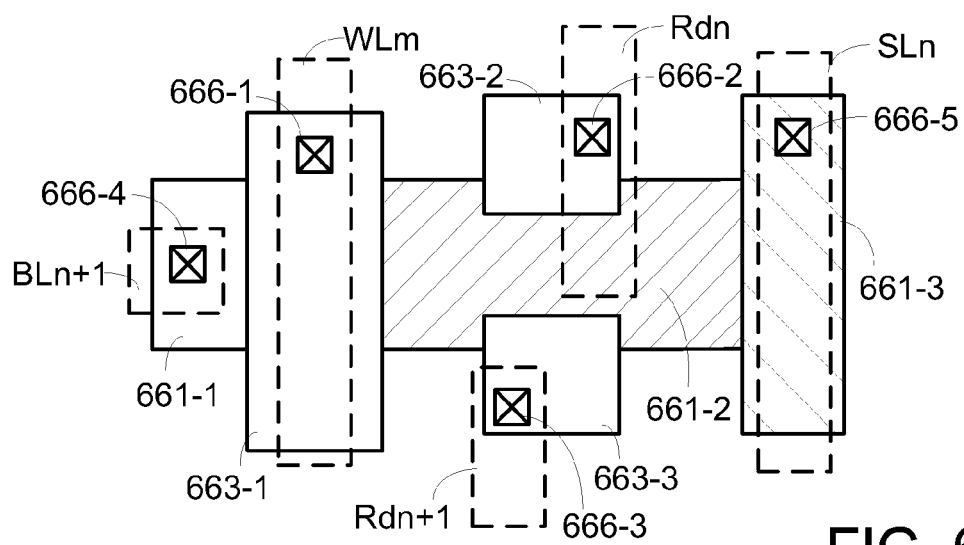
FIG. 6B is a schematic top view illustrating the second state cell structure of the mask read-only memory as shown in FIG. 6A.
Figure 6C:
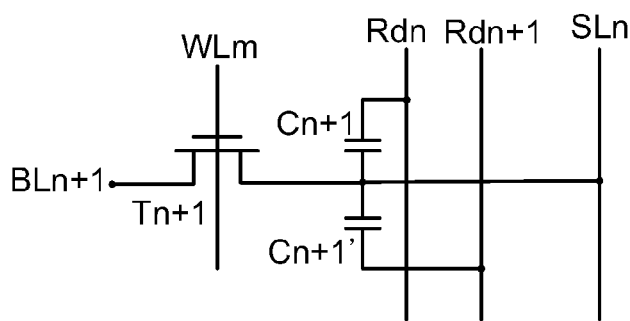
FIG. 6C schematically illustrates an equivalent circuit of the second state cell structure of the mask read-only memory as shown in FIG. 6A.

FIG. 6A is a schematic perspective view illustrating a second state cell structure of the mask read-only memory according to the second embodiment of the present invention. FIG. 6B is a schematic top view illustrating the second state cell structure of the mask read-only memory as shown in FIG. 6A. FIG. 6C schematically illustrates an equivalent circuit of the second state cell structure of the mask read-only memory as shown in FIG. 6A. Please refer to FIGS. 6A, 6B and 6C. The second state cell structure 650 has a substrate with a P-well region 610. A first gate structure, a second gate structure and a third gate structure are formed on the P-well region 610 of the substrate. The first gate structure comprises a gate oxide layer 671 and a first polysilicon gate 663-1 on the gate oxide layer 671. The second gate structure comprises a gate oxide layer 670 and a second polysilicon gate 663-2 on the gate oxide layer 670. The third gate structure comprises a gate oxide layer 672 and a third polysilicon gate 663-3 on the gate oxide layer 672.

Moreover, a first N+ diffusion region 661-1 and a second N+ diffusion region 661-2 are formed in a surface of the P-well region 610 of the substrate. The first N+ diffusion region 661-1 is located adjacent to a first side of the first gate structure. The second N+ diffusion region 661-2 is located adjacent to a second side of the first gate structure and extended to a first side of the second gate structure and a first side of the third gate structure. Moreover, the third N+ diffusion region 661-3 is contacted with the second N+ diffusion region 661-2.

Moreover, a first contact 666-1 is formed on the first polysilicon gate 663-1, a second contact 666-2 is formed on the second polysilicon gate 663-2, a third contact 666-3 is formed on the third polysilicon gate 663-3, a fourth contact 666-4 is formed on the first N+ diffusion region 661-1, and a fifth contact 666-5 is formed on the third N+ diffusion region 661-3.

After the second state cell structure 650 as shown in FIG. 6A is fabricated, a metallization process is performed. That is, the fourth contact 666-4 is connected to a bit line BLn+1, the first contact 666-1 is connected to a word line WLm, the second contact 666-2 is connected to a read line Rdn, the third contact 666-3 is connected to another read line Rdn+1, and the fifth contact 666-5 is connected to a select line SLn (see FIG. 6B).

The equivalent circuit of the second state cell structure is schematically shown in FIG. 6C. The first N+ diffusion region 661-1, the first gate structure and the second N+ diffusion region 661-2 are collaboratively defined as a transistor Tn+1. The second gate structure and the second N+ diffusion region 661-2 are collaboratively defined as a capacitor Cn+1. The third gate structure and the second N+ diffusion region 661-2 are collaboratively defined as another capacitor Cn+1'. The gate terminal of the transistor Tn+1 is connected to the word line WLm. A first terminal of transistor Tn+1 is connected to the bit line BLn+1. A second terminal of transistor Tn+1 is connected to a first end of the capacitor Cn+1, a first end of the capacitor Cn+1' and the select line SLn. A second end of the capacitor Cn+1 is connected to the read line Rdn. A second end of the capacitor Cn+1' is connected to the read line Rdn+1.

From the above discussions, the first state cell structure and the second state cell structure are distinguished because the second N+ diffusion region and the third N+ diffusion region of the second state cell structure are contacted with each other. That is, if the second N+ diffusion region and the third N+ diffusion region of a cell structure are contacted with each other, this cell structure is the second state cell structure. Whereas, if the second N+ diffusion region and the third N+ diffusion region of a cell structure are separated from each other, this cell structure is the first state cell structure. During a process of defining a diffusion mask, the manufacturer may determine whether the second N+ diffusion region and the third N+ diffusion region of the cell structure are contacted with each other or not. Consequently, the fabricated mask read-only memory has two types of cell structures with different storing states.

Figure 7:
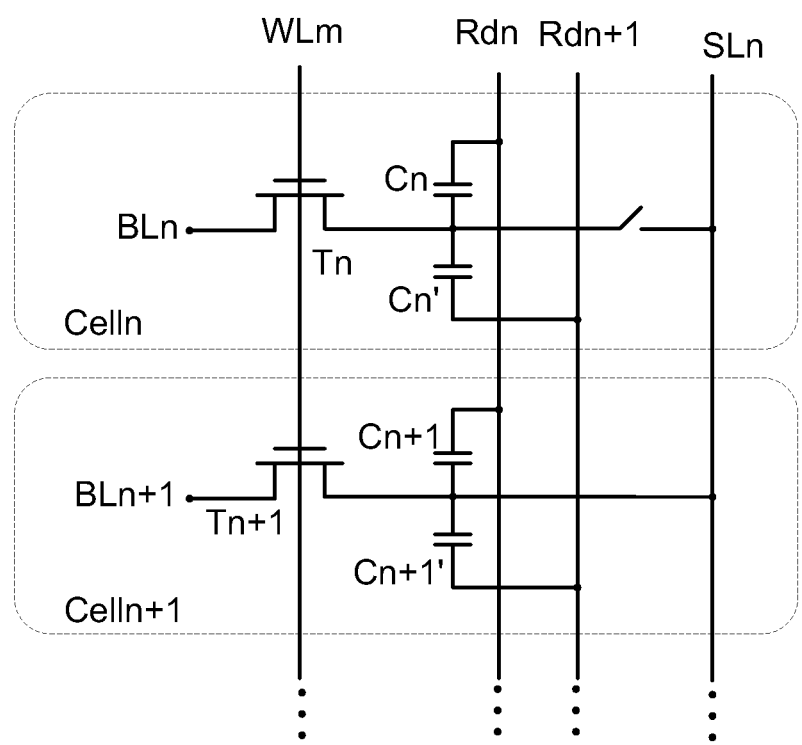
FIG. 7 schematically illustrates an equivalent circuit of the first state cell structure and the second state cell structure of the mask read-only memory according to the second embodiment of the present invention.

FIG. 7 schematically illustrates an equivalent circuit of the first state cell structure and the second state cell structure of the mask read-only memory according to the second embodiment of the present invention. As shown in FIG. 7, a first cell Celln records a first storing state, and a second cell Celln+1 records a second storing state. During a read cycle of reading the data from the first cell and the second cell, a word line voltage is received by the word line WLm, a read voltage is received by the two read lines Rdn and Rdn+1, and a select line voltage is received by the select line SLn. In an embodiment, each of the word line voltage, the read voltage and the select line voltage is equal to a power supply voltage (Vcc), e.g. 3.3V.

When the word line voltage (3.3V) is received by the word line WLm, the transistors Tn and Tn+1 are turned on. In the first cell Celln, the read voltage (3.3V) fails to be transmitted from the read lines Rdn and Rdn+1 to the bit line BLn, and the select line voltage (3.3V) fails to be transmitted from the select line SLn to the bit line BLn. Consequently, a first bit line voltage on the bit line BLn is 0V. In the second cell Celln+1, the read voltage (3.3V) can be transmitted from the select line SLn to the bit line BLn+1. Consequently, a second bit line voltage on the bit line BLn+1 is 3.3V. That is, during the read cycle, the word line voltage, the read voltage and the select line voltage are provided to the mask read-only memory. According to the bit line voltage, the storing state of the cell is detected.

However, those skilled in the art will readily observe that numerous modifications and alterations may be made while retaining the teachings of the invention. For example, during the read cycle, only the select voltage is provided to the select line SLn, but the 3 is not provided to the read lines Rdn and Rdn+1. Similarly, the storing state of the cell can be accurately detected according to the bit line voltage.

From the above descriptions, the present invention provides a novel mask read-only memory. After the mask read-only memory leaves the factory, the mask read-only memory has two types of cell structures. The first type cell structure records a first storing state (e.g. the logic state "1"), and the second type cell structure records a second storing state (the logic state "0").

Furthermore, the read voltage (3.3V) and the select voltage (3.3V) may result in a higher read current outputted from bit line BLn+1 because of the lower resistance of the Tn+1 during the read cycle. Also, the higher read current may consume more electrical energy and damage the mask read-only memory. For better lifetime and power consumption of the mask read-only memory, lower read voltage and select voltage (for example 1.5V) maybe use to distinguish the storing state of cells during the read cycle. That is to say, the read voltage and the select voltage are less than the power supply voltage (Vcc) if lifetime and power consumption of the mask read-only memory are concerned.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A mask read-only memory, comprising:
a substrate;
a first gate structure formed on a surface of the substrate for receiving a word line voltage during a read cycle;
a second gate structure formed on the surface of the substrate for receiving a read voltage during the read cycle;
a third gate structure formed on the surface of the substrate;
a first diffusion region formed in the surface of the substrate and located adjacent to a first side of the first gate structure for generating a first bit line voltage during the read cycle;
a second diffusion region formed in the surface of the substrate, and located adjacent to a second side of the first gate structure and extended to a first side of the second gate structure and a first side of the third gate structure;
a fourth gate structure formed on the surface of the substrate for receiving the word line voltage during the read cycle;
a fifth gate structure formed on the surface of the substrate for receiving the read voltage during the read cycle;
a sixth gate structure formed on the surface of the substrate;
a third diffusion region formed in the surface of the substrate and located adjacent to a first side of the fourth gate structure for generating a second bit line voltage during the read cycle;
a fourth diffusion region formed in the surface of the substrate, and located adjacent to a second side of the fourth gate structure and extended to a first side of the fifth gate structure and a first side of the sixth gate structure, wherein the fourth diffusion region receives the read voltage during the read cycle;
wherein the first bit line voltage is different from the second bit line voltage.

2. The mask read-only memory as claimed in claim 1, wherein the first bit line voltage is lower than the second bit line voltage.

3. The mask read-only memory as claimed in claim 1, wherein each of the word line voltage and the read voltage is equal to a power supply voltage.

4. The mask read-only memory as claimed in claim 1, wherein the read voltage is less than a power supply voltage.

5. The mask read-only memory as claimed in claim 1, wherein the substrate has a P-well region, and the first diffusion region, the second diffusion region, the third diffusion region and the fourth diffusion region are N+ diffusion regions.

6. The mask read-only memory as claimed in claim 1, wherein a contact is formed on the fourth diffusion region and connected to a first read line, wherein during the read cycle, the fourth diffusion region receives the read voltage through the first read line and the contact.

7. The mask read-only memory as claimed in claim 1, wherein two contacts are formed on the first gate structure and the fourth gate structure, respectively, and connected to a word line, wherein during the read cycle, the first gate structure and the fourth gate structure receive the word line voltage through the word line and the two contacts.

8. The mask read-only memory as claimed in claim 1, wherein two contacts are formed on the second gate structure and the fifth gate structure, respectively, and connected to a first read line, wherein during the read cycle, the second gate structure and the fifth gate structure receive the read voltage through the first read line and the two contacts.

9. The mask read-only memory as claimed in claim 1, wherein two contacts are formed on the third gate structure and the sixth gate structure, respectively, and connected to a second read line, wherein during the read cycle, the third gate structure and the sixth gate structure receive the read voltage through the second read line and the two contacts.

10. A mask read-only memory, comprising:
a substrate;
a first gate structure formed on a surface of the substrate for receiving a word line voltage during a read cycle;
a second gate structure formed on the surface of the substrate;
a third gate structure formed on the surface of the substrate;
a first diffusion region formed in the surface of the substrate and located adjacent to a first side of the first gate structure for generating a first bit line voltage during the read cycle;
a second diffusion region formed in the surface of the substrate, and located adjacent to a second side of the first gate structure and extended to a first side of the second gate structure and a first side of the third gate structure;
a third diffusion region formed in the surface of the substrate for receiving a select line voltage during the read cycle;
a fourth gate structure formed on the surface of the substrate for receiving the word line voltage during the read cycle;
a fifth gate structure formed on the surface of the substrate;
a sixth gate structure formed on the surface of the substrate;
a fourth diffusion region formed in the surface of the substrate and located adjacent to a first side of the fourth gate structure for generating a second bit line voltage during the read cycle;
a fifth diffusion region formed in the surface of the substrate, and located adjacent to a second side of the fourth gate structure and extended to a first side of the fifth gate structure and a first side of the sixth gate structure;

a sixth diffusion region formed in the surface of the substrate and contacted with the fifth diffusion region for receiving the select line voltage during the read cycle;

wherein the first bit line voltage is different from the second bit line voltage.

11. The mask read-only memory as claimed in claim 10, wherein the first bit line voltage is lower than the second bit line voltage.

12. The mask read-only memory as claimed in claim 10, wherein each of the word line voltage and the select line voltage is equal to a power supply voltage.

13. The mask read-only memory as claimed in claim 10, wherein the read voltage and the select line voltage are less than a power supply voltage.

14. The mask read-only memory as claimed in claim 10, wherein the substrate has a P-well region, and the first diffusion region, the second diffusion region, the third diffusion region, the fourth diffusion region, the fifth diffusion region and the sixth diffusion region are N+ diffusion regions.

15. The mask read-only memory as claimed in claim 10, wherein two contacts are formed on the third diffusion region and the sixth diffusion region, respectively, and connected to a select line, wherein during the read cycle, the third diffusion region and the sixth diffusion region receive the select line voltage through the select line and the two contacts.

16. The mask read-only memory as claimed in claim 10, wherein two contacts are formed on the second gate structure and the fifth gate structure, respectively, and connected to a first read line, wherein during the read cycle, the second gate structure and the fifth gate structure receive a read voltage through the first read line and the two contacts.

17. The mask read-only memory as claimed in claim 16, wherein two additional contacts are formed on the third gate structure and the sixth gate structure, respectively, and connected to a second read line, wherein during the read cycle, the third gate structure and the sixth gate structure receive the read voltage through the second read line and the two additional contacts.

18. The mask read-only memory as claimed in claim 17, wherein the read voltage is equal to a power supply voltage.

19. The mask read-only memory as claimed in claim 10, wherein two contacts are formed on the first gate structure and the fourth gate structure, respectively, and connected to a word line, wherein during the read cycle, the first gate structure and the fourth gate structure receive the word line voltage through the word line and the two contacts.

* * * * *